United States Patent [19]

Hanawa

[11] Patent Number: 4,665,364

[45] Date of Patent: May 12, 1987

[54] MAGNETIC RESONANCE IMAGING SYSTEM

[75] Inventor: Masatoshi Hanawa, Ootawara, Japan

[73] Assignee: Kabushiki Kaisha Toshiba, Kawasaki, Japan

[21] Appl. No.: 699,960

[22] Filed: Feb. 8, 1985

[30] Foreign Application Priority Data

Feb. 10, 1984 [JP] Japan .................................. 59-23084

[51] Int. Cl.$^4$ ............................................ G01R 33/20
[52] U.S. Cl. ................................... 324/309; 324/308; 128/653
[58] Field of Search ............... 324/300, 307, 308, 309, 324/312, 313, 314, 317

[56] References Cited

U.S. PATENT DOCUMENTS

| | | | |
|---|---|---|---|
| 4,528,510 | 7/1985 | Loeffler et al. | 324/308 |
| 4,551,678 | 11/1985 | Morgan et al. | 128/653 |
| 4,585,992 | 4/1986 | Maudsley | 324/309 |

*Primary Examiner*—Michael J. Tokar
*Attorney, Agent, or Firm*—Finnegan, Henderson, Farabow, Garrett & Dunner

[57] ABSTRACT

In a magnetic resonance imaging system, a reference sample made of material including predetermined atomic nuclei to be tomographed is disposed on the side of an object under inspection in a tomographing field (an area to be tomographed) of an MR image. In collecting projection data by detecting the MR signal, the magnitude of the projection data on the reference sample is detected. A substantial gain of an MR signal amplifying section is adjusted according to the detected magnitude.

9 Claims, 11 Drawing Figures

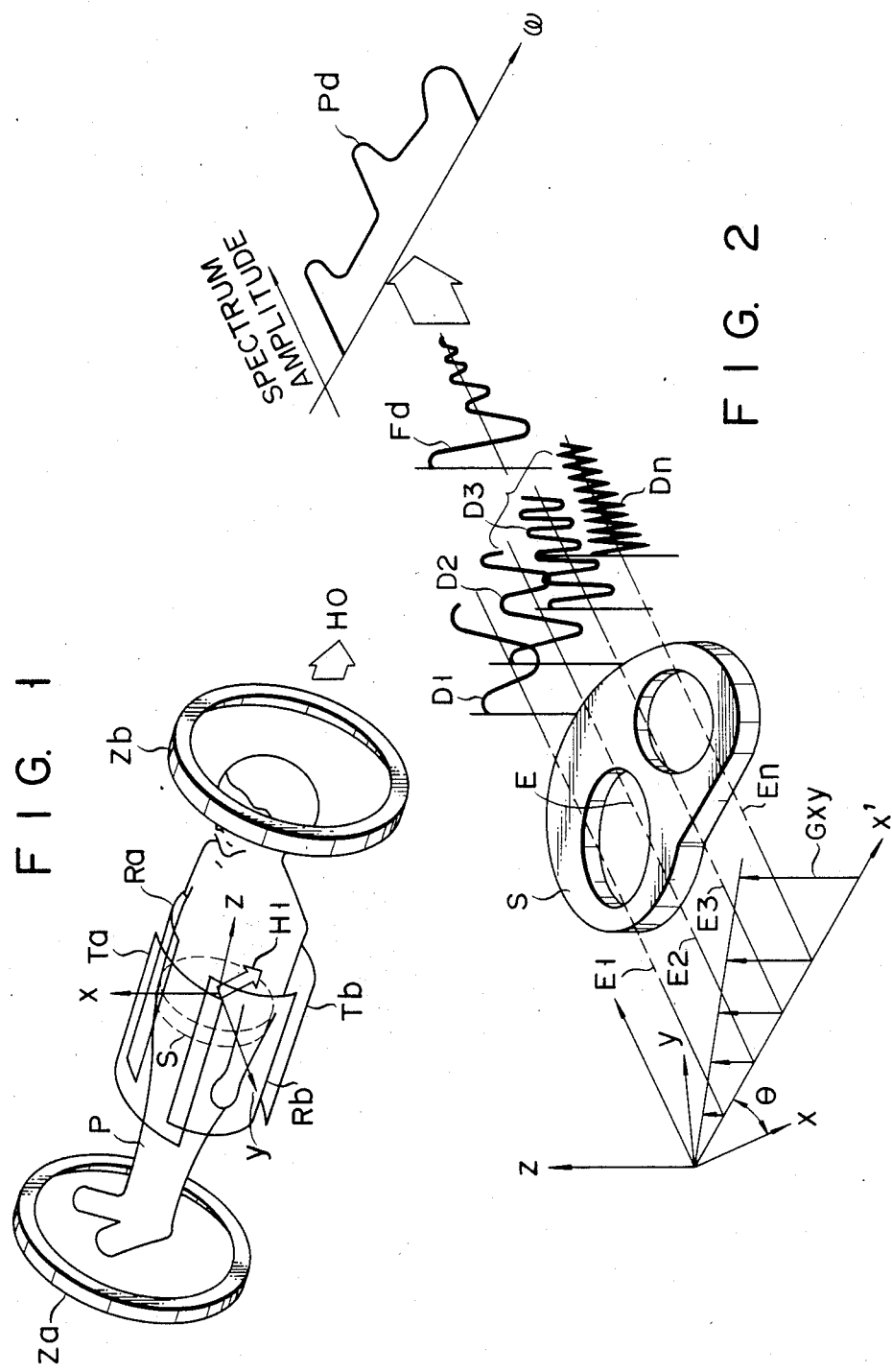

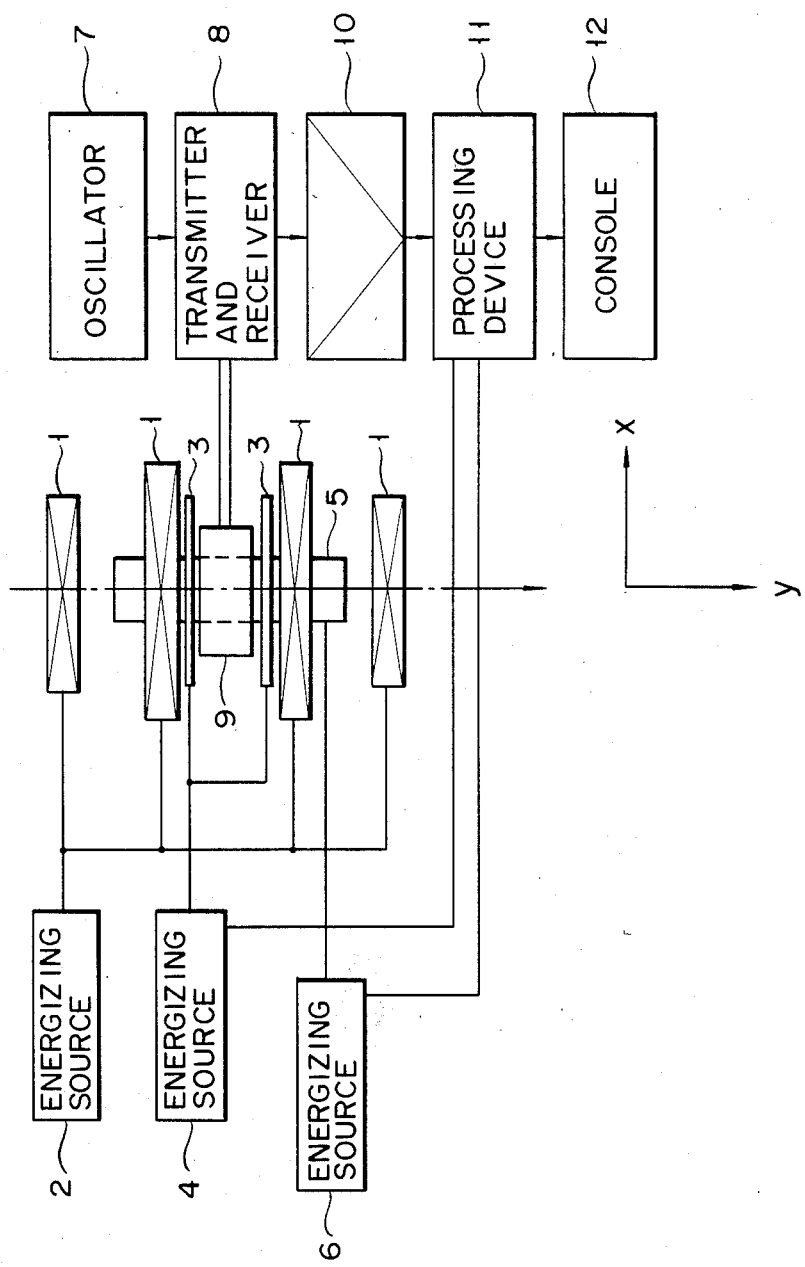

F I G. 6
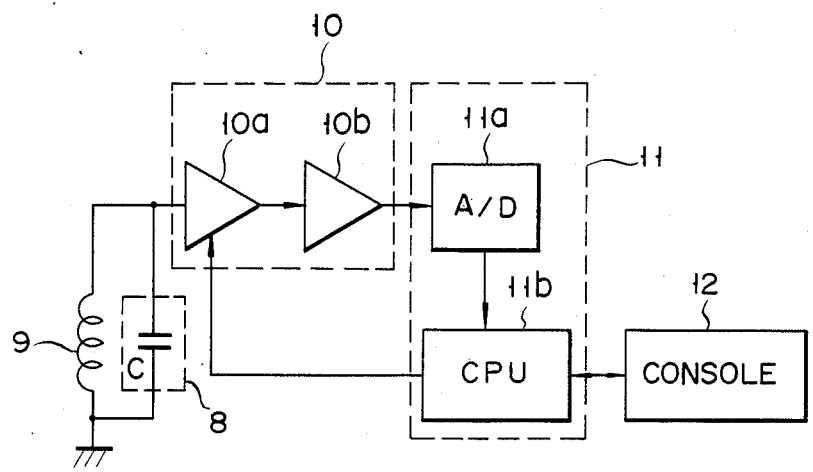
F I G. 7
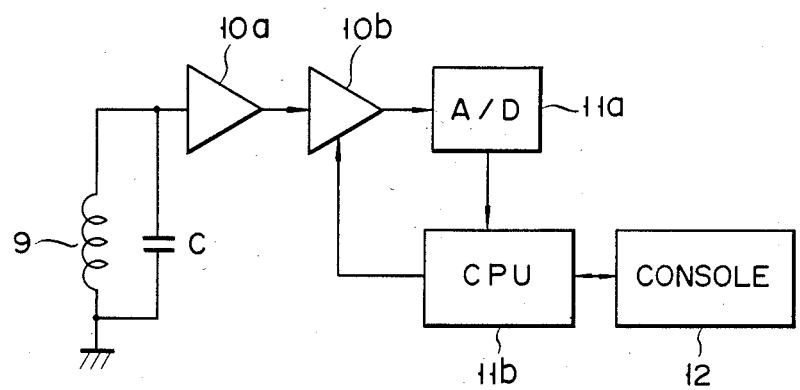

MAGNETIC RESONANCE IMAGING SYSTEM

BACKGROUND OF THE INVENTION

The present invention relates to a magnetic resonance imaging (MRI) system.

In the MRI system, a magnetic resonance (MR) signal of an object under inspection is detected by making use of a magnetic resonance (MR) phenomenon. The detected data is subjected to an image reconstruction process by computed tomography (CT), and then programmed into a computed tomogram as a density distribution of specific atomic nuclei and a relaxation time constant distribution of a specific cross section of the object. The MRI system was initially developed for diagnosis in the medical field, but recently its application for nondestructive inspection has been studied.

In order to obtain a tomogram at a specific position of an object in the MRI system, an extremely uniform static magnetic field Ho is applied to an object under inspection, e.g., a human body P, in the direction of a z axis in FIG. 1. A linear magnetic gradient field Gz is superposed on the static magnetic field Ho by a pair of inclined magnetic field coils Za and Zb. In the gradient field Gz, the direction of the magnetic field is directed along the z axis, and its intensity is gradually increased or decreased along the z axis in a linear fashion. Under this condition, there are a number of x−y isomagnetic planes in parallel to each other and perpendicular to the z axis.

The atomic nucleus resonates with the static magnetic field Ho at an angular frequency ωo as given below $$\omega o = \gamma Ho \quad (1)$$

where γ is a gyromagnetic ratio peculiar to the atomic nucleus, and its value depends on the type of atomic nucleus under study.

As mentioned above, when the human body P is under the static magnetic field Ho and the magnetic gradient field Gz, a pair of transmitting coils Ta and Tb applies (to the human body P) a rotating magnetic field H1 at an angular frequency wo to resonate only a specific atomic nucleus, viz., the angular frequency ωo for the specific atomic nucleus.

When the human body P is subjected to such magnetic fields, the MR phenomenon is caused only in a plane selected as an isomagnetic plane with a specific intensity, by the magnetic gradient field Gz, for example, an x−y plane in FIG. 1. The plane is a cross section which is used to obtain a tomogram of a slice S (which actually has a given thickness).

The MR phenomenon is observed as a free induction decay (FID) signal, through the receiving coils Ra and Rb. This signal is then Fourier transformed to have a single spectrum on the angular frequency ωo of the specific atomic nucleus. To reconstruct the tomograph as a computed tomogram, it is necessary to have projection information in as many directions in the x−y plane as in the slice S.

To obtain the projection information, after the slice S is excited to cause the MR phenomenon, a magnetic gradient field Gxy with a linear slope of the magnetic field along an x' axis (rotated by angle θ from the x axis on the x−y plane), as shown in FIG. 2, is superposed onto the static magnetic field Ho. As shown, the magnetic gradient field Gxy is such that its direction is in parallel with the z axis and its intensity gradually increases or decreases in the x' direction in a linear fashion. The magnetic gradient field Gxy causes linear and equal magnetic lines E1 to En with different values to be formed in the slice S of the human body P. The rotating angular frequencies ωo, of the nuclear spin of the specific atomic nuclei on the isomagnetic lines E1 to En, take values dependent on the intensities of the magnetic fields, which are each defined by the formula (1). Signals D1 to Dn as FID signals must be generated by the magnetic fields on the isomagnetic lines E1 to En. The amplitudes of the signals D1 to Dn are proportional to the density of the nuclear spins of the specific atomic nuclei, viz., the density of the specific atomic nuclei, on the isomagnetic lines E1 to En passing through the slice S. Actually, these signals D1 to Dn are not observed individually, but in the form of a composite FID signal Fd as the sum of these signals D1 to Dn. The projection data (one dimensional image) Pd to the x' axis of the slice S is obtained by Fourier transforming the composite signal Fd. By successively rotating the x' axis in the x−y plane (by changing θ), the projection data is collected for each predetermined angle, thereby obtaining projection data in each direction of the x−y plane. The projection data is used for the image reconstruction, to form a computed tomogram.

The rotation of the magnetic gradient field Gxy, that is, the change of θ, will be described.

The magnetic gradient fields Gx and Gy in the x and y directions, respectively are formed by pairs of magnetic gradient field coils. These magnetic gradient fields Gx and Gy are combined to form a composite magnetic gradient field Gxy. One of the two pairs of magnetic gradient field coils is controlled to change the ratio of the magnetic gradient field Gx to that of the magnetic gradient field Gy. Then, the inclining direction of the composite magnetic field Gxy is changed.

When the human body P is placed between the receiving coils Ra and Rb, a quality factor (Q) of each of these coils is changed, as a matter of course. The change in Q depends on features of the human body P, for example, adult or child, fat or skinny, man or woman, the physical configuration of the human body P, large or small, etc. As a result, it is equivalent to the change in the gain of the receiving system.

When Q is changed, the density of specific atomic nuclei on the image (e.g., a proton density) inevitably changes depending on the differentials of the human body P. This fact rejects a quantitative evaluation of the MR image data.

SUMMARY OF THE INVENTION

Accordingly, an object of the present invention is to provide a magnetic resonance imaging system which can keep an optimum gain in a receiving system irrespective of the differentials of the object under inspection, thus eliminating variation in the MR data due to the differentials of the object, and enabling an absolute evaluation of the MR image.

In the present invention, a reference sample made of material containing predetermined atomic nuclei to be tomographed, is placed on the side of an object under inspection in an imaging field of an MR image (area to be tomographed). When collecting projection data by the detection of the MR signal, the magnitude of the projection data of the reference sample is detected. A substantial gain in an MR signal receiving processing system is adjusted according to the magnitude. Therefore, the MR data on the reference sample can be kept at a fixed value irrespective of the differentials of the objects.

BRIEF DESCRIPTION OF THE DRAWINGS

FIGS. 1 and 2 show views useful in explaining the principles of the magnetic resonance imaging;

FIG. 3 is a block diagram showing an arrangement of a magnetic resonance imaging system which is an embodiment of the present invention;

FIG. 6 is a block diagram showing an arrangement of a receiving processing system of the MRI system; and FIGS. 7 to 9 are respectively block diagrams of major portions of different embodiments of a MRI system according to the present invention.

DETAILED DESCRIPTION OF THE PREFERRED EMBODIMENTS

Figure 4A:
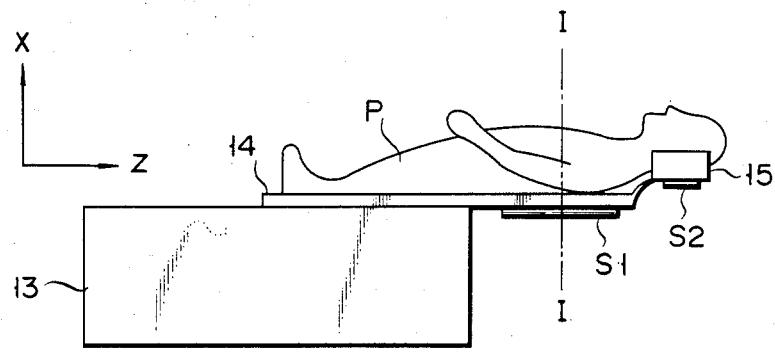
FIGS. 4A and 4B show views illustrating a table of the MRI system on which an object under inspection lies.

Reference is made to FIG. 3 illustrating an arrangement of an embodiment of an MRI system according to the present invention. In the figure, a first coil assembly 1 consisting of four air-core coils for generating a uniform static magnetic field Ho in an imaging area, is energized by an energizing source 2. A second coil 3 for generating a magnetic gradient field Gz which is superposed on the static magnetic field Ho at the imaging area, is energized by a second energizing source 4. The second coil 3 corresponds to the coils Za and Zb shown in FIG. 1, for example. A third coil 5 for generating a magnetic gradient field Gxy, which is superposed on the static magnetic field Ho in the imaging area, is energized by a third energizing source 6. An oscillator 7 generates an exciting signal for exciting a slice to cause an MR phenomenon. The exciting signal is applied to a transmitter/receiver 8, so that a rotating magnetic field at a rotating angular frequency ωo is applied to the imaging area, through a probe head 9, thereby causing the MR phenomenon. An MR signal resulting from the MR phenomenon is received by the transmitter/receiver 8 through the probe head 9. The probe head 9 corresponds to the transmission coils Ta and Tb and the receiving coils Ra and Rb shown in FIG. 1. The MR signal received by the transmitter/receiver 8 is amplified and detected by an amplifier/detector 10, and is then applied to a data processing device 11. The data processing device 11 controls the operation of the second energizing sources 4 and 6. The data processing device 11 includes a means for A/D converting the applied MR signal, a means for Fourier transforming the digitized signal by a DFT (discrete Fourier transform), for example, an FFT (fast Fourier transform), thereby to have the projection data on the MR data, and a means for image processing the projection data to reconstruct an image. The MR image reconstructed by the data processing device 11 is visually displayed by a display at a console 12.

A table of the MRI system on which a human body P as the object under inspection will be described in detail.

Figure 4B:
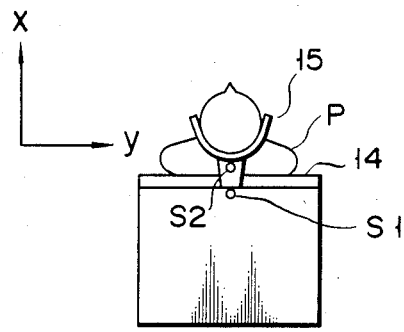

In FIGS. 4A and 4B, a human body P lies on the table 13. A reference sample S1 is secured to the under side of that portion of a table board 14 which supports the torso of the human body P. Another reference sample S2 is set on the back side of a head rest 15 for supporting the head of the human body P. These reference samples S1 and S2 are used for providing reference data, which is used to obtain the optimum gain in the receiving system. The reference samples S1 and S2 may be made of material containing a nuclear spin system emitting an MR signal at the same frequency as that of the atomic nuclei to be tomographed, viz., usually the tomographed atomic nuclei has a known, stable density. If the photographed atomic nuclei are hydrogen atomic nuclei, the reference samples S1 and S2 may be rubber or water in a proper container.

Figure 5A:
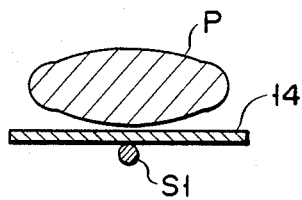
FIGS. 5A and 5B show respectively a cross section taken on line I—I of FIG. 4A useful in explaining the operation of the MRI system, and the projection data collected traversing the cross section.
Figure 5B:
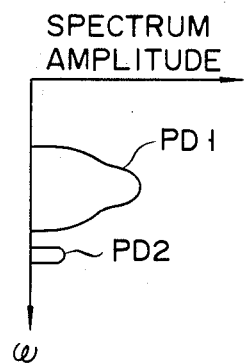

A cross section along line I—I shown in FIG. 4A is shown in FIG. 5A, and the projection data distributed on the cross section in the y direction is illustrated in FIG. 5B.

As FIGS. 5A and 5B show, the projection data consists of two components PD1 and PD2. PD1 is the component on the patient P, and PD2 the component on the reference sample S1. When the sample S1 is placed beside the patient P, not within the body or in a recess of the body, there exists a projection angle, which can be used jointly with the position data (i.e., the angular frequency ωo of PD1 and PD2) to distinguish the data components PD1 and PD2 from each other. When the samples S1 and S2 are put on the under side of the board 14 and the head rest 15, as shown in FIGS. 4A and 4B, the data components on these samples can be discriminated in accordance with the position data (i.e., the angular frequencies of these components) which has been obtained by y-axis projection.

FIG. 6 shows an arrangement of a receiving processing system of the MRI system of this embodiment.

An MR signal on the human body P and the reference sample S1, that is, a FID signal, is detected by the probe head 9. The MR signal is then tuned by a tuning circuit composed of the probe head 9 and a tuning capacitor C in the transmitter/receiver 8, and amplified by an amplifier 10a in the amplifier/detector 10, and further detected by a detector 10b of the amplifier/detector 10. The MR signal is passed through an A/C converter 11a in the data processing device 11, and input to a central processing unit (CPU) 11b of the data processing device 11. The digitized MR signal is subjected to the DFT, usually the FFT, by the CPU 11b, and is transformed into the projection data. In the usual tomographing, the image reconstruction processing (and other necessary processings) are performed on the basis of the projection data collected in many directions. With such a processing, however, the Q of the probe head 9 changes with differentials of the human bodies P, as mentioned above. An amplification of the tuning circuit made up of the probe head 9 and the capacitor C changes, and a magnitude of the projection data changes. As a result, a quantitative diagnosis based on the image finally formed is impossible.

In the present embodiment, however, when the amplification of the tuning circuit changes due to the differentials of the human bodies P, a magnitude of the projection data PD2 of the reference sample S1 (in tomographing the cross section along line I—I) changes correspondingly. The projection data PD2 of the reference sample S1 can easily be separated from the projection data PD1 of the human body P by an angular frequency, as already mentioned. The magnitude of the projection data PD2 changes with respect to a value preset according to a proper magnitude for the reference sample S1, the CPU 11b detects this and feeds it back to the receiving side. Specifically, the amplifier 10a is constructed with a variable gain amplifier. A gain in the amplifier 10a is controlled, by the CPU 11b, according to a deviation of the magnitude of the projection data PD2 from the preset value, so that the deviation is zero (that is, the magnitude of the projection data PD2 is equal to the preset value).

Usually, it is sufficient to make the adjustment of one projection before the intended tomographing. If necessary, it may be done by interrupting the tomographing during the tomographing of a plurality of frames. The console 12 for system operation connected to the CPU 11b, is also used for the system operation through the CPU 11b in addition to the image display by the output from the CPU 11b.

As described above, the projection data PD2 of the reference sample S1 is kept at a fixed value irrespective of the differentials of the human body P. Even for different human bodies P, the MR signals derived from the same portions take the same values on the MR image. Thus, the MR image data can be obtained as absolute image data.

As described above, the tomographing can always be made at a proper receiving gain for the reference sample. Accordingly, the MR image data can be obtained from the absolute data, not the relative data. Therefore, the MR image data can be qualitatively and clinically evaluated.

In this case, if the MR data (e.g. a proton density) of the reference sample is known, the MR data (e.g. a proton density) can be calibrated by this value, thereby ensuring further reliable MR image data.

It should be understood that the present invention is not limited to the embodiments thus far described, but may be changed and modified within the scope of the present invention.

Figure 8:
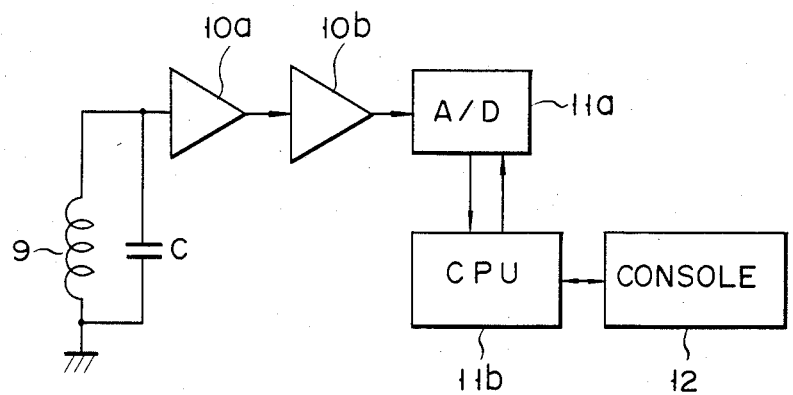

Some modifications of the embodiments as mentioned above will be given. In FIG. 7, the feedback is made from the CPU 11b to the detector 10b, to change a detector gain. In FIG. 8, the feedback is made from the CPU 11b to the A/C converter 11a, to change a converting gain of the A/C converter 11a (the magnitude of the quantitizing step, i.e., weighting of the digital values) and to substantially change a gain of the receiving system.

An example of the digital control to substantially change a gain in the receiving system, not the analog control as in the above-mentioned case, will be described referring to FIG. 9.

Figure 9:
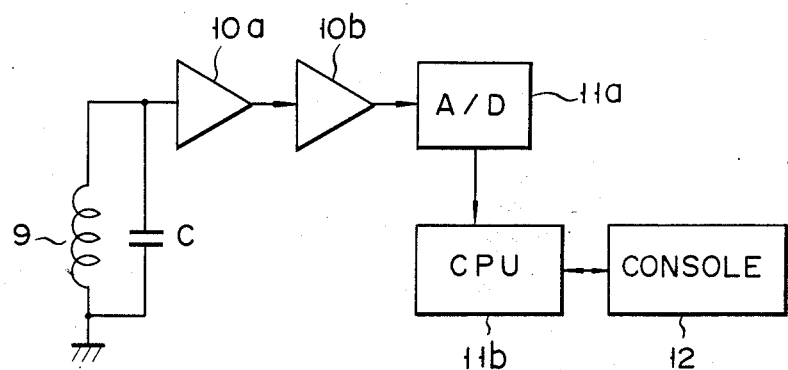

In FIG. 9, an MR signal is tuned by the tuning circuit, amplified by the amplifier 10a' (in this case, a variable gain is not required), and detected and extracted by the detector 10b. The MR signal is inputted to the CPU 11b via the A/C converter 11a. In obtaining the projection data by the FFT in the CPU 11b, from the projection data of the reference sample, a correction coefficient such that the magnitude of the projection data is used as a preset value, is obtained. Correction by the correction coefficient is applied to the projection data (e.g. PD1) of the human body P. Thus, in this example, the feed forward control with an open loop is realized by only the digital processing.

The reference sample may be provided at any place if it is located on the side of the object under inspection and in the imaging area. To make the reference sample effective irrespective of the location of the slice, the reference sample is preferably placed on an object support member (such as a table), has an appropriate length, and is directed in the axial direction of the object.

What is claimed is:

1. A magnetic resonance imaging system comprising:
   coil means disposed around an imaging area in which an object under inspection is placed;
   signal detecting means, which cooperates with said coil means, for causing, in cooperation with said coil means, a magnetic resonance phenomenon in specific atomic nuclei in said imaging area and for detecting resultant magnetic resonance signals from a predetermined cross-section in said imaging area;
   signal processing means for obtaining as an output thereof projection data by applying a predetermined process to said magnetic resonance signals detected by said signal detecting means;
   imaging reconstructing means for obtaining image data based on said projection data from said cross-section by applying an image reconstructing process to said projection data;
   first and second reference samples made of material including said specific atomic nuclei;
   a table having a table board for supporting said object in said imaging area, with said first reference sample located under said board contiguous to said object;
   a head rest mounted on said table board, with said second reference sample located under said head rest contiguous to said object;
   reference means for obtaining a value of the projection data from said reference samples from said output of said signal processing means; and
   gain adjust means for controlling one of said signal detecting means, said signal processing means and said image reconstructing means according to the value obtained by said reference means, to control a substantial gain in said system.

2. The apparatus according to claim 1, in which said coil means includes a static magnetic field coil means for generating a uniform static magnetic field, a first inclined magnetic field coil means for generating a magnetic field inclination to specify a cross-section to be tomographed, a second inclined magnetic field coil means for generating a magnetic field inclination to specify a projecting direction, and a transmitting-/receiving coil means for applying a rotating magnetic field corresponding to the resonance frequency of said specific atomic nuclei in said imaging area and for receiving magnetic resonance signals caused by the application of the rotating magnetic field.

3. The apparatus according to claim 1, in which said signal processing means includes Fourier transforming means for obtaining the projection data from said received MR signal.

4. The apparatus according to claim 1, in which said gain adjust means changes the substantial gain of said processing system by controlling the weighting on a plurality of pieces of the projection data in said image reconstructing means.

5. The apparatus according to claim 1, in which said gain adjust means changes the substantial gain of a receiving processing system by controlling the detected gain by said signal detecting means.

6. The apparatus according to claim 5, in which said detecting means includes an amplifier for amplifying a received signal, and said gain adjusting means controls an amplifying gain on the detected signal in said amplifier to change the substantial detected gain of said signal detecting means.

7. The apparatus according to claim 5, in which said detecting means includes a detector circuit for detecting a received signal, and said gain adjust means controls a detecting gain on the detected signal in said detecting circuit, thereby to change the substantial detecting gain of said detecting means.

8. The apparatus according to claim 1, in which said gain adjust means changes the substantial gain of said receiving system by controlling a gain of said signal processing means.

9. The apparatus according to claim 8, in which said signal processing means includes an analog to digital converting means for converting the detected signal, and a discrete Fourier transform means for discrete Fourier transforming the converted detected signal, and said gain adjust means controls a converting gain of said converting means to change the substantial gain of said signal processing means.

* * * * *